United States Patent [19]
Nomura et al.

[11] Patent Number: 4,948,330
[45] Date of Patent: Aug. 14, 1990

[54] ALIGNMENT STAGE DEVICE

[75] Inventors: Takehiko Nomura; Ryoichi Suzuki, both of Yokohama, Japan

[73] Assignee: Kabushiki Kaisha Toshiba, Kawasaki, Japan

[21] Appl. No.: 305,761

[22] Filed: Feb. 3, 1989

[30] Foreign Application Priority Data

| Feb. 8, 1988 | [JP] | Japan | 63-26790 |
| Feb. 12, 1988 | [JP] | Japan | 63-30405 |
| May 31, 1988 | [JP] | Japan | 63-132994 |

[51] Int. Cl.⁵ ............... B65G 47/24; B23Q 1/18; G02B 21/26; H01L 21/68
[52] U.S. Cl. ............... 414/749; 414/743; 350/531; 269/73
[58] Field of Search ........... 269/73, 71; 350/531, 350/532; 414/749, 783, 781, 780, 754

[56] References Cited

U.S. PATENT DOCUMENTS

| 3,466,514 | 9/1969 | Brunner et al. | 414/754 |
| 3,508,806 | 4/1970 | Hall | 350/531 |
| 3,652,146 | 3/1972 | George | 350/531 |
| 3,829,978 | 8/1974 | Basin et al. | 269/71 |
| 3,918,167 | 11/1975 | Gerber | 269/73 |
| 4,193,317 | 3/1980 | Oono et al. | 269/71 |
| 4,248,498 | 2/1981 | Georges | 350/531 |
| 4,457,664 | 7/1984 | Judell et al. | 414/754 |
| 4,609,264 | 9/1986 | Poduin et al. | 350/532 |
| 4,667,415 | 5/1987 | Barsky | 269/73 |
| 4,770,600 | 9/1988 | Ishikawa | 414/783 |

FOREIGN PATENT DOCUMENTS

| 58-78642 | 5/1983 | Japan. | |
| 0152632 | 7/1987 | Japan | 269/71 |
| 63-25946 | 2/1988 | Japan. | |
| 0892836 | 3/1962 | United Kingdom | 350/531 |

Primary Examiner—David H. Brown
Attorney, Agent, or Firm—Cushman, Darby & Cushman

[57] ABSTRACT

An alignment stage device comprising first and second stages supported on a base and movable in those directions which are perpendicular to each other on a horizontal plane, and a third stage provided with stands on which a workpiece is mounted, and movable relative to each of the stages, wherein when the first stage is moved, the second and third stages are moved together with the first stage and when the second stage is moved, the third stage is moved together with the second stage and wherein the first and second stages are square frames each having center opening and the second stage is arranged in the center opening of the first stage while the third stage is arranged in the center opening of the second stage.

15 Claims, 8 Drawing Sheets

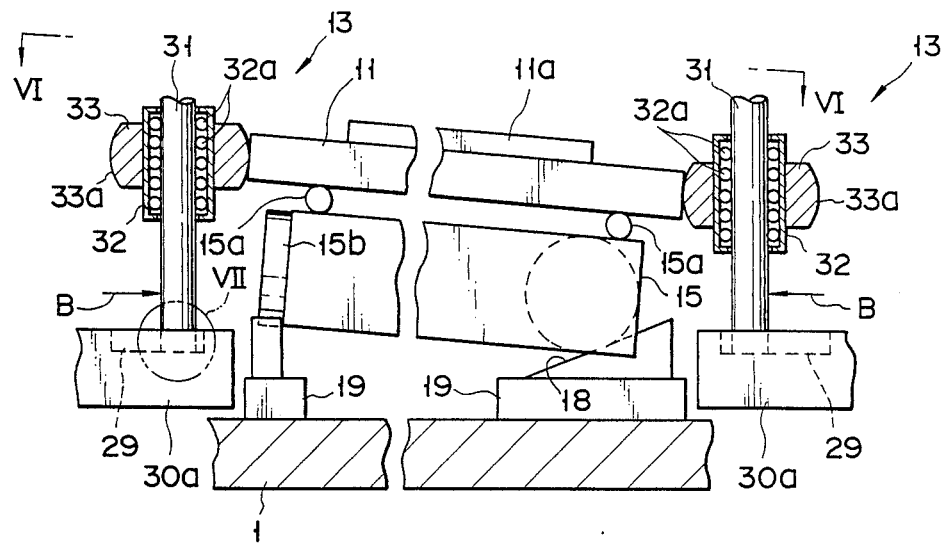
F I G. 5
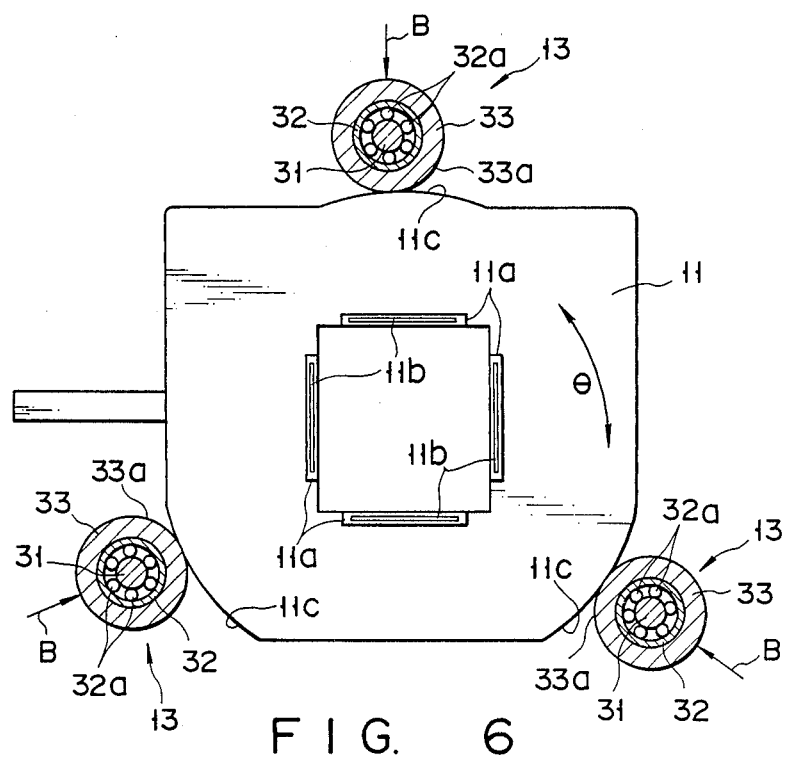
F I G. 6

ALIGNMENT STAGE DEVICE

BACKGROUND OF THE INVENTION

1. Field of the Invention

The present invention relates to an alignment stage device capable of aligning the reticle or mask, which has been set on the exposure means in the course of manufacturing semiconductor elements, for example, relative to the projection lenses and the like.

2. Description of the Related Art

The aligning of the reticles or masks which are used to produce the semiconductor elements is usually attained by the alignment stage device which provides motions in plural degree of freedom by plural stages to precisely align the reticles or masks. More specifically, the alignment stage device has X and y stages which can move with the precision of micron order along X and y axes perpendicular to each other on a horizontal plane, and a θ stage which can rotate round an axis perpendicular to the horizontal plane. When movements of these stages are combined with one another, the reticle or mask set on this alignment stage device can be aligned relative to the projection lenses and the like.

In the case of the conventional alignment stage device, x, y and θ stages are mounted one upon the other and each of them is guided in one direction by a pair of guide members. The height of the whole alignment stage device, therefore, equals to the sum of thicknesses of x, y and θ stages and heights of stages bases for supporting x, y and θ stages. In addition, the alignment stage device needs a large number of parts to guide these stages.

Further, ultraviolet- and X-rays which are exposed have become shorter and shorter in wavelength as the semiconductor elements and patterns which are exposed and transferred are made finer in size. In order to enhance the precision of controlling the reticles or masks and holding the interval between the reticle and the projection lens, therefore, there has been proposed an alignment stage device provided with further Z stage, which can move up and down, as well as x, y and θ stages. When Z stage is added like this, the alignment stage device becomes higher and the device itself becomes larger in size, accordingly. In addition, the number of parts used is increased to guide Z stage.

Although Z stage is added to enhance the control precision, the control precision is reversely reduced because the alignment stage device becomes larger in size. Therefore, the addition of Z stage is not so effective as to enhance the control precision.

SUMMARY OF THE INVENTION

The object of the present invention is to provide an alignment stage device, smaller in size, capable of aligning the reticles or masks with higher accuracy.

In order to achieve this object of the present invention, there is provided an alignment stage device comprising a base; a first stage supported on the base and movable along a first axis on a horizontal plane; a second stage supported on the first stage and movable along an axis perpendicular to the first axis; and a third stage provided with a mount on which a workpiece is mounted, and guided relative to the second stage, said third stage being rotatable round an axis perpendicular to that plane on which the third stage is positioned; wherein when the first stage is moved, the second and third stages are moved along the first axis line and when the second stage is moved, the third stage is moved along the second axis and wherein the first and second stages are square frames each having a center opening and the second stage is arranged in the center opening of the first stage while the third stage is arranged in the center opening of the second stage.

According to an alignment stage device of the present invention, the second and third stages can be arranged in the first stage on a same plane. When these stages are assembled with one another, therefore, the whole thickness of these stages equals to that of one of these stages, thereby enabling the whole alignment stage device to be made smaller in size.

Further, according to another example of the alignment stage device of the present invention wherein the third stage can be moved up and down and tilted relative to the base by means of a fourth stage, the third stage can be controlled directly by the fourth stage to thereby enhance the alignment precision.

This and other objects as well as merits of the present invention will become apparent from the following detailed description with reference to the accompanying drawings.

BRIEF DESCRIPTION OF THE DRAWINGS

FIG. 5 shows the support system attached;

FIG. 6 is a sectional view taken along a line VI—VI in FIG. 5;

DETAILED DESCRIPTION OF THE PREFERRED EMBODIMENTS

Figure 1:
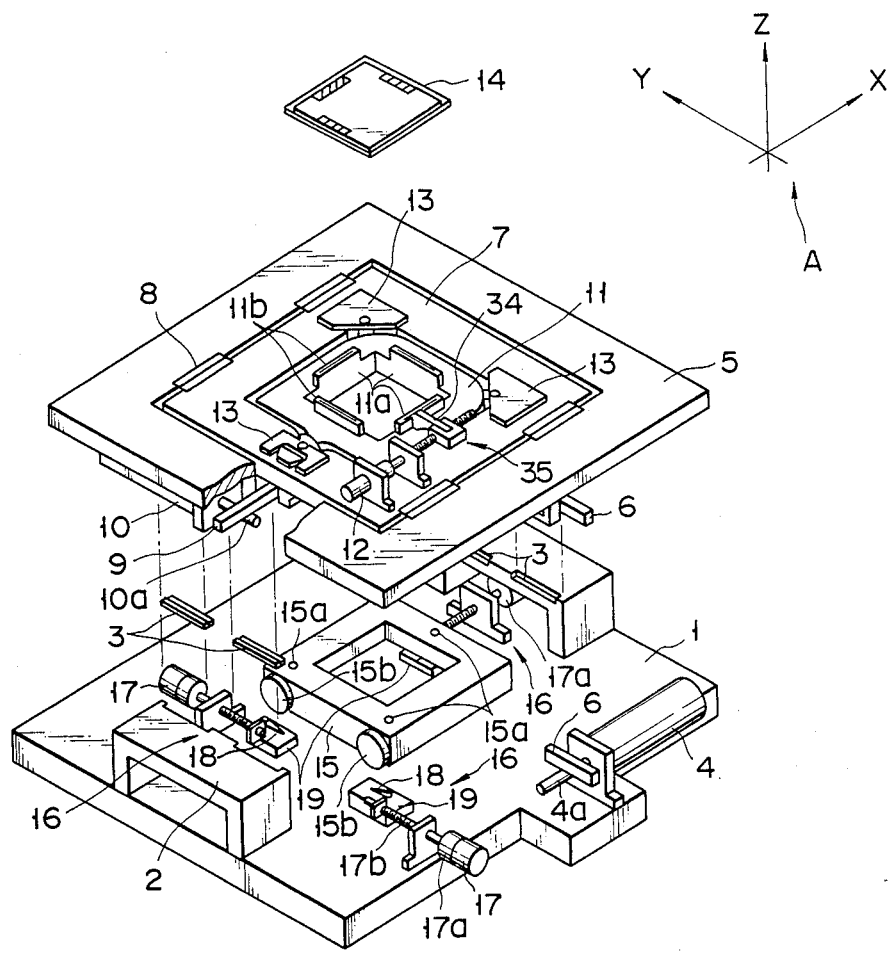
FIG. 1 is a perspective view showing a first example of the alignment stage device according to the present invention dismantled.

FIG. 1 is a perspective view showing an example of the alignment stage device of the present invention dismantled. This alignment stage device can be used as a reticle stage for producing semiconductor elements and it may be applied to machine tools as well.

As shown in FIG. 1, the alignment stage device has base 1 made rectangular by a thick plate. Two support stands 2 and 2 are erected from the upper surface of base 1 on both sides thereof and opposed to each other to horizontally support y stage 5 which is a first stage made as a substantially square frame. Two y stage guides 3 are formed along each of those opposed upper corners of support stands 2 and 2 to guide y stage 5 along axis of coordinate A.

This y stage 5 is driven in the direction of axis y by reversible DC servomotor 4 fixed to base 1. Rectangular rod-like drive slider 6 which is pressed from above against shaft 4a of drive motor 4 at a right angle is fixed to y stage 5 to drive y stage 5 in the direction of axis y.

Figure 2:
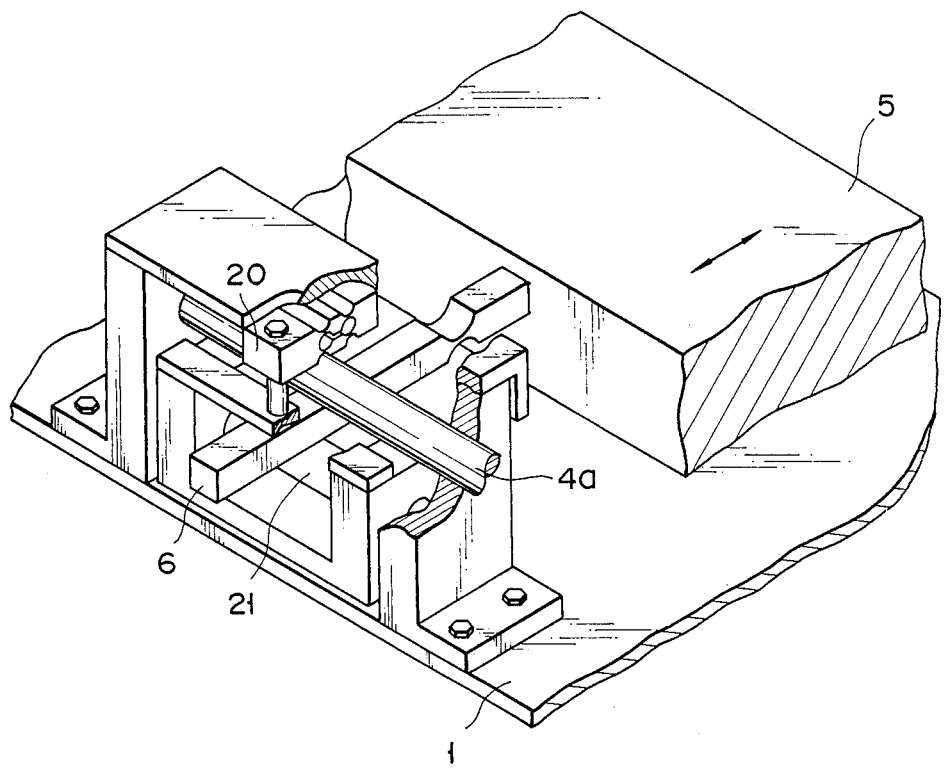
FIG. 2 shows a driver system for linearly moving x or y stage of the alignment stage device shown in FIG. 1.

As shown in FIG. 2, friction drive slider 6 is pressed against shaft 4a by preload applied from the usual friction drive system to prevent shaft 4a from being slid and drive bar 6 from becoming unsteady and being backrushed. More specifically, shaft 4a is pressed against friction drive slider 6 by preloader 20 and friction drive slider 6 is held between shaft 4a and back up roller 21. Therefore, the rotating motion of shaft 4a is changed to rectilinear motion by the friction drive system to rectilinearly drive friction drive slider 6, so that y stage can be moved in the direction of axis y of a coordinate shown by A in FIG. 1. This movement of y stage 5 can be detected by a y axis sensor (not shown) and the position of y stage 5 can be feedback-controlled responsive to the result thus detected.

As shown in FIG. 1, x stage 7 similar to y stage 5 and made by a square frame plate serving as a second stage is arranged in the center opening of y stage 5. Four guides 8 are located between x and y stages 7 and 5 to guide x stage 7 relative to y stage 5 in the direction of axis x. Friction drive slider 9 is extended outward from x stage 7 and pressed against shaft 10a of reversible DC servomotor 10, which is fixed to y stage 5, by a same friction drive system as shown in FIG. 2. This prevents shaft 10a from sliding relative to friction drive slider 9, so that x stage 7 can be moved in the direction of axis x of coordinate A when shaft 10a is rotated. The movement of x stage 7 can be detected by an x axis sensor (not shown) and the position of x stage 7 can be feedback-controlled according to the result thus detected.

$\theta$ stage 11 which serves as a third stage is arranged in the center opening of x stage 7. This $\theta$ stage 11 has stands 11a, on which reticle (or mask) 14 is mounted, in the center thereof and each of these stands 11a is provided with an opening 11b communicated with a vacuum source (not shown) to fix reticle 14 by vacuum suction. As will be described later, $\theta$ stage 11 is rotatably attached to x stage 7 through three guides 13 and it is rotated in a small range round an axis perpendicular to the plane, on which x stage 7 is positioned, by means of DC servomotor 12 attached onto x stage 7.

$\theta$ stage 11 can be rotated round axial lines parallel to axes x and y and also moved in the direction of axis z by means of z stage 15 which serves as a fourth stage.

Figure 3:
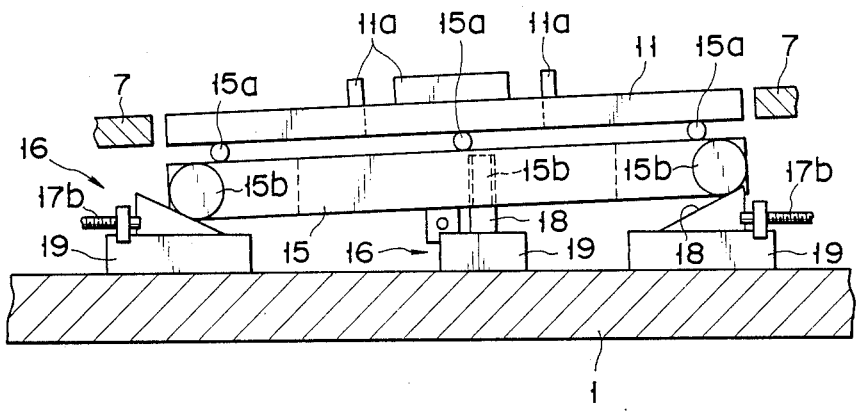
FIG. 3 is intended to explain the association of θ and z stages shown in FIG. 1.

As shown in FIGS. 1 and 3, z stage 15 made by a thick plate as a square frame and arranged between support stands 2 and 2 on base 1 and under $\theta$ stage 11 can be moved up and down and tilted as well. Three steel balls 15a freely rotatable at their certain positions are arranged on the upper surface of z stage 15 and $\theta$ stage 11 is supported on z stage 15 through these steel balls 15a.

Steel balls 15a are contacted with both of $\theta$ and z stages 11 and 15 and can transmit the movement of z stage 15 to $\theta$ stage 11. $\theta$ stage 11 is thus moved up and down and tilted relative to base 1, following the movement of z stage 15. Further, $\theta$ stage 11 can rotate on the upper surface of z stage 15 through these steel balls 15a. When $\theta$ stage 11 rotates relative to z stage 15, steel balls 15a serve as ball bearings and the rotation of $\theta$ stage 11 is not transmitted to z stage 15.

As shown in FIG. 1, z stage 15 is supported by z stage drive systems 16, which are located at three apexes of a triangular on base 1, in such a manner that it can be linearly moved in the direction of axis z or rotated round axial lines parallel to axes x and y or tilted relative to base 1. Each of drive systems 16 includes reversible DC servomotor 17 fixed to base 1 to drive z stage 15, slider 19 linearly movable on the upper surface of base 1 due to the rotation of shaft 17b of motor 17, slope 18 formed on slider 19 and cam follower 15b attached to z stage 15 and contacted with slope 18. Z stage 15 is supported on base 1 by slopes 18 on sliders 19 of z stage drive systems 16 and cam followers 15b. Z stage drive motor 17 is connected in this case to shaft 17b through harmonic drive reduction system 17a, for example, to enable shaft 17b to receive reduced number of rotation from motor 17. Drive motor 17 may be connected directly to shaft 17b.

A ball nut screw is formed round the outer circumference of shaft 17b while a ball nut which can be screwed onto the ball nut screw is fixed to slider 19, so that the rotation of drive motor 17 can be changed to the rectilinear motion of slider 19 due to these screw and nut. Three sliders 19 can be thus moved on base 1 at the same time or independently of the others by drive motor 17 through its shaft 17b. According to the moving amount of each of sliders 19, z stage 15 is moved in the direction of axis z, up and down in FIGS. 1 and 3 or tilted, that is, rotated round axial lines parallel to axes x and y. FIG. 3 shows z stage 15 tilted relative to base 1 to tilt $\theta$ stage 11 through steel balls 15a.

As shown in FIG. 1 and FIGS. 4 through 6, three arc portions 11c, each having the same radius of curvature and curved around the same point, are formed along the outer rim of $\theta$ stage (FIG. 6) to rotatably guide $\theta$ stage round an axial line perpendicular to that plane on which $\theta$ stage is positioned, and $\theta$ stage 11 is supported at these arc portions 11c by x stage 7 through guides 13. According to the present invention, the curved portions 11c can have different radii of curvatures.

These guides 13 are located facing the center opening of x stage 7 and each of guides 13 includes forked bracket 30 fixed to x stage 7, strut 31 supported by bracket 30 at both ends thereof, and guide ring 33 attached to strut 31 through ball bushing 32 in which a plurality of balls 32a are freely rotatably housed, the outer circumference of this guide ring having spherical face 33a when sectioned in the direction of its axial line. This guide ring 33 can freely rotate round strut 30 due to ball bushing 32 and also move along strut 30 in the direction of its axial line.

Figure 4:
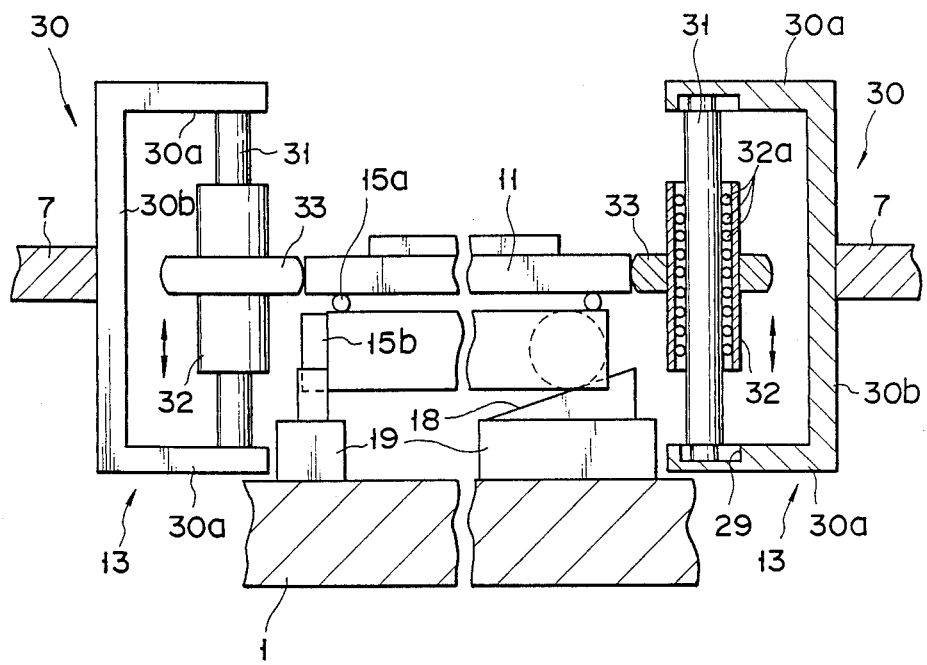
FIG. 4 shows a system for supporting θ stage of the alignment stage device.
Figure 7:
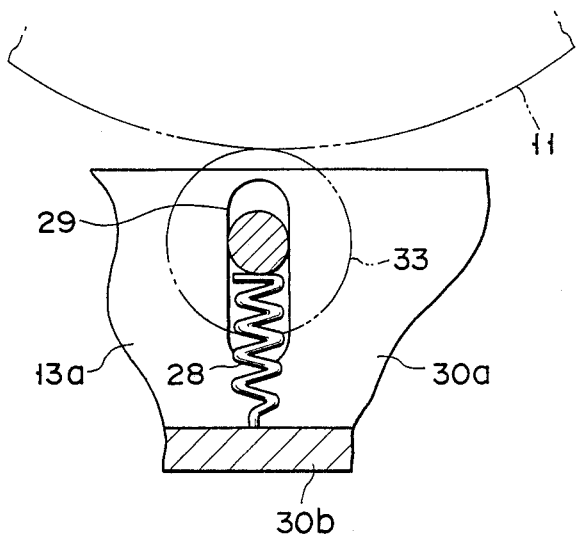
FIG. 7 is an enlarged plan showing that portion of the support system which is encircled by a two-dot and dash line in FIG. 5.

As apparent from $\theta$ stage 11 kept horizontal in FIG. 4 and tilted in FIG. 5, $\theta$ stage 11 is held by guide rings 33, keeping their spherical faces 33a contacted with arc portions 11c of $\theta$ stage 11. For the purpose of holding $\theta$ stage in this manner, each of opposed arms 30a of bracket 30 is provided with slit 29 which is directed toward the center of $\theta$ stage 11, and each end of struts 31 is inserted into this slit 29. As shown in FIG. 7, strut 31 is urged in the longitudinal direction of slit 29 or toward the center of 0 stage 11 by means of spring 28 whose one end is fixed to connecting section 30b of bracket 30. The direction in which strut 31 is urged by spring 28 is represented by arrow B in FIGS. 5 and 6.

When guides 13 are arranged as shown in FIG. 6, $\theta$ stage is held by three guides 13 at three arc portions 11c thereof. Struts 31 of stage guides 13 are urged toward the center of $\theta$ stage by means of springs 28 in this case. Therefore, guide rings 33 push arc portions 11c of $\theta$ stage 11 toward the center of $\theta$ stage 11. When $\theta$ stage 11 rotates round an axial line perpendicular to that plane on which θ stage 11 is positioned, guide rings 33 hold θ stage 11 while being rotated by friction force caused between their spherical faces 33a and arc portions 11c of θ stage 11. Further, the outer circumference of each of those guide rings 33 which urge arc portions 11c of θ stage 11 is formed as spherical face 33a. Even when θ stage 11 is moved along axis z or tilted relative to base 1 by means of z stage drive systems 16, therefore, guide rings 33 can move along struts 31 in the direction of the axial line of each of these struts 31 due to their ball bushings 32 to thereby hold arc portions 11c of θ stage 11 in them with uniform force. Whatever posture θ stage may be to take, therefore, stage guides 13 can follow the movement of θ stage 11 to reliably hold θ stage 11 at an accurate position.

Although each of struts 31 has been urged toward the center of θ stage 11 by means of spring 28 in this example, it may be arranged instead of using springs 28 that each of guide rings 33 is made of rubber and that struts 31 are urged by the elasticity of these rubber-made guide rings 33.

As shown in FIG. 1, θ stage 11 has drive slider 34 projected from the outer rim of θ stage 11 and made as a rectangular plate. θ stage 11 is rotated in a certain angular range round an axial line perpendicular to that plane, on which θ stage 11 is positioned, by means of θ stage drive system 35 through drive slider 34.

Figure 8:
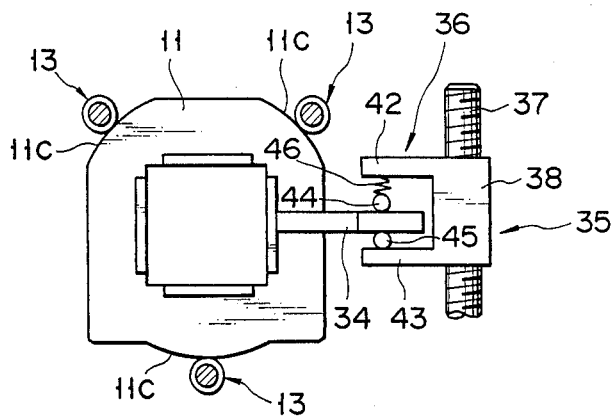
FIGS. 8 and 9 show a drive system for θ stage of the alignment stage device shown in FIG. 1.
Figure 9:
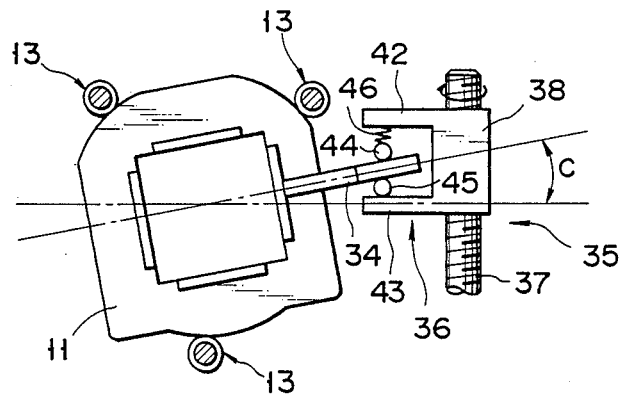
Figure 10:
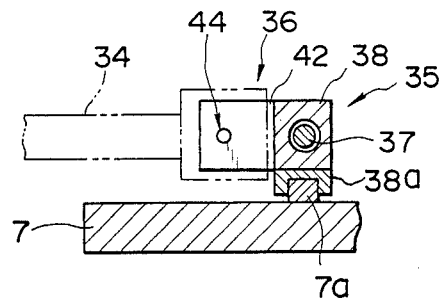
FIGS. 10 and 11 show θ stage and the drive system combined.
Figure 11:
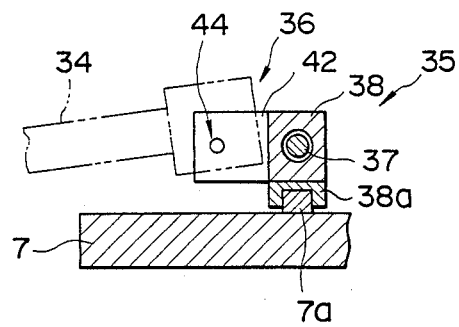

As shown in detail in FIGS. 8 through 11, θ stage drive system 35 serves as a linear actuator comprising feed screw 37 horizontally positioned and connected to drive motor 12 which is fixed to x stage (see FIG. 1), and nut member 38 screwed onto feed screw 37. As shown in FIGS. 10 and 11, guide rail 7a is fixed onto the upper surface of x stage 7 along the axial line of feed screw 37 and cross roll table 38a (from which rollers are omitted in FIGS. 10 and 11) which is guided by guide rail 7a is formed integral to that side of nut member 38 which faces x stage 7. When drive motor 12 (see FIG. 1) is driven, therefore, feed screw 37 is rotated. Nut member 38 screwed onto feed screw 37 is thus guided by rail 7a to move in the axial direction of feed screw 37.

Figure 12:
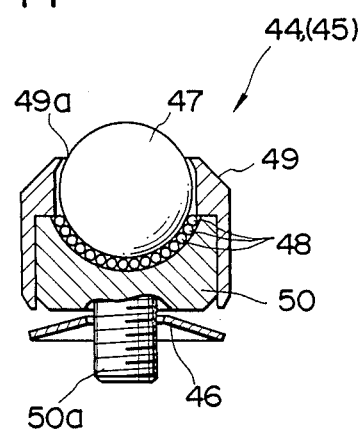
FIG. 12 is a sectional view showing a one point ball bearing which is a member for transmitting the drive force of the drive system to θ stage.

Transmission system 36 which serves to transmit the movement of nut member 38 in the axial direction of feed screw 37 to drive slider 34 includes a pair of tongue pieces 42 and 43 projected from both ends of nut member 38 toward drive slider 34 or θ stage 11, and push members 44 and 45 arranged on both opposed sides of these tongue pieces 42 and 43. This push member is made as a one point ball bearing, as shown in FIG. 12. One of these two push members 44 and 45 or the one 44 on tongue piece 42 in the example shown in FIGS. 8 and 9 is attached to the side of tongue piece 42 through belleville spring 46, for example, which has high rigidity, while the other 45 is attached directly to tongue piece 43.

As shown in FIG. 12, the one point ball bearing which serves as push member 44 or 45 includes fixing block 50 attached to tongue piece 42 or 43 of nut member 38, large-diameter steel ball 47 freely rotatably seated on a plurality of small-diameter steel balls 48 in a recess of the fixing block and cover 49 for holding this large-diameter steel ball 47. Fixing block 50 has a thread 50a through which fixing block 50 is attached to the tongue of the nut member, and cover 49 has center opening 49a through which a part of large-diameter steel ball 47 is exposed. That portion of large-diameter steel ball 47 which is exposed through the center opening 49a of cover 49 can rotate on the side of drive slider 34 to serve as push member 44 or 45 attached to tongue piece 42 or 43, so that the movement of drive system 35 which serves as the linear actuator can be reliably transmitted to drive slider 34.

The front end portion of drive slider 34 to which tongue pieces 42 and 43 are opposed may be made larger in area, as shown by two-dot and dash lines in FIGS. 10 and 11, to reliably keep the push members contacted with drive slider 34 when θ stage is tilted relative to the base following the movement of z stage. Drive system 35 may use such appropriate means as the linear motor, hydraulic cylinder and piezo-element instead of feed screw 37 and nut member 38.

When feed screw 37 of drive system 35 is rotated under such a state as shown in FIG. 8 by means of drive motor 12 (see FIG. 1), nut member 38 screwed onto feed screw 37 is guided by rail 7a to move in the axial direction of feed screw 37. Push members 44 and 45 of transmission system 36 attached to nut member 38 transmit drive force to drive slider 34 of θ stage 11.

θ stage 11 is held at its arc portions 11c by guides 13. Therefore, θ stage 11 is rotated round an axial line perpendicular to that plane, on which θ stage 11 is positioned, only by angle C as shown in FIG. 9 due to drive force transmitted to drive slider 34, said angle C corresponding to the rotation amount of feed screw 37. Large-diameter steel balls 47 which serve as the push members rotate on both sides of drive slider 34 at this time. Therefore, friction force is hardly caused between drive slider 34 and drive force transmission system 36 to thereby rotate θ stage 11 smoothly.

Even when θ stage 11 is tilted following the tilting of x stage 15 (see FIG. 1 and FIGS. 3 through 5), large-diameter steel ball 47 of push member 44 rotates on the side of drive slider 34, as shown in FIG. 11, and θ stage 11 is reliably held at a correct position by means of guides 13, as shown in FIG. 5. θ stage 11 is thus rotated with reliability.

According to the above-described alignment stage device shown in FIG. 1, the movement of x stage 7 caused by drive motor 10 through friction drive system and slider 9 and that of z stage 15 caused by drive motors 17 through drive systems 16 are transmitted directly to θ stage 11. The movement of y stage 5 caused by drive motor 4 through friction drive system and slider 6 is transmitted to θ stage 11 through x stage 7. Further, θ stage 11 itself can be rotated relative to x stage 7 and round an axial line perpendicular to that plane, on which θ stage 11 is positioned, by means of drive motor 12 through drive system 35 and drive slider 34. θ stage 11 can thus achieve six motions including three linear movements in those directions parallel to axes x, y and z and three rotary movements round those axial lines parallel to axes x, y and z.

In the case of the above-described alignment stage device, x, y and θ stages 5, 7 and 11 are arranged on a same plane and the thickness of each of these stages 5, 7 and 11 is substantially same. The whole thickness of three stages 5, 7 and 11 can be thus within the thickness of one stage. In other words, the height of three stages 5, 7 and 11 equals to that of one stage. Therefore, the height of the whole alignment stage device can be made smaller (than 65 mm, for example), thereby enabling the device to be smaller-sized. Further, z stage 15 for supporting θ stage 11 is located under that plane on which x, y and θ stages 5, 7 and 11 are arranged. θ stage 11 can thus follow the movement of z stage 15 directly to enhance its control precision. Furthermore, θ stage 11 is supported by base 1 through z stage 15. Even when any error is caused in those movements of x and y stages 7 and 5 in the direction of axis z, therefore, it will not add any influence to θ stage 11.

Figure 13:
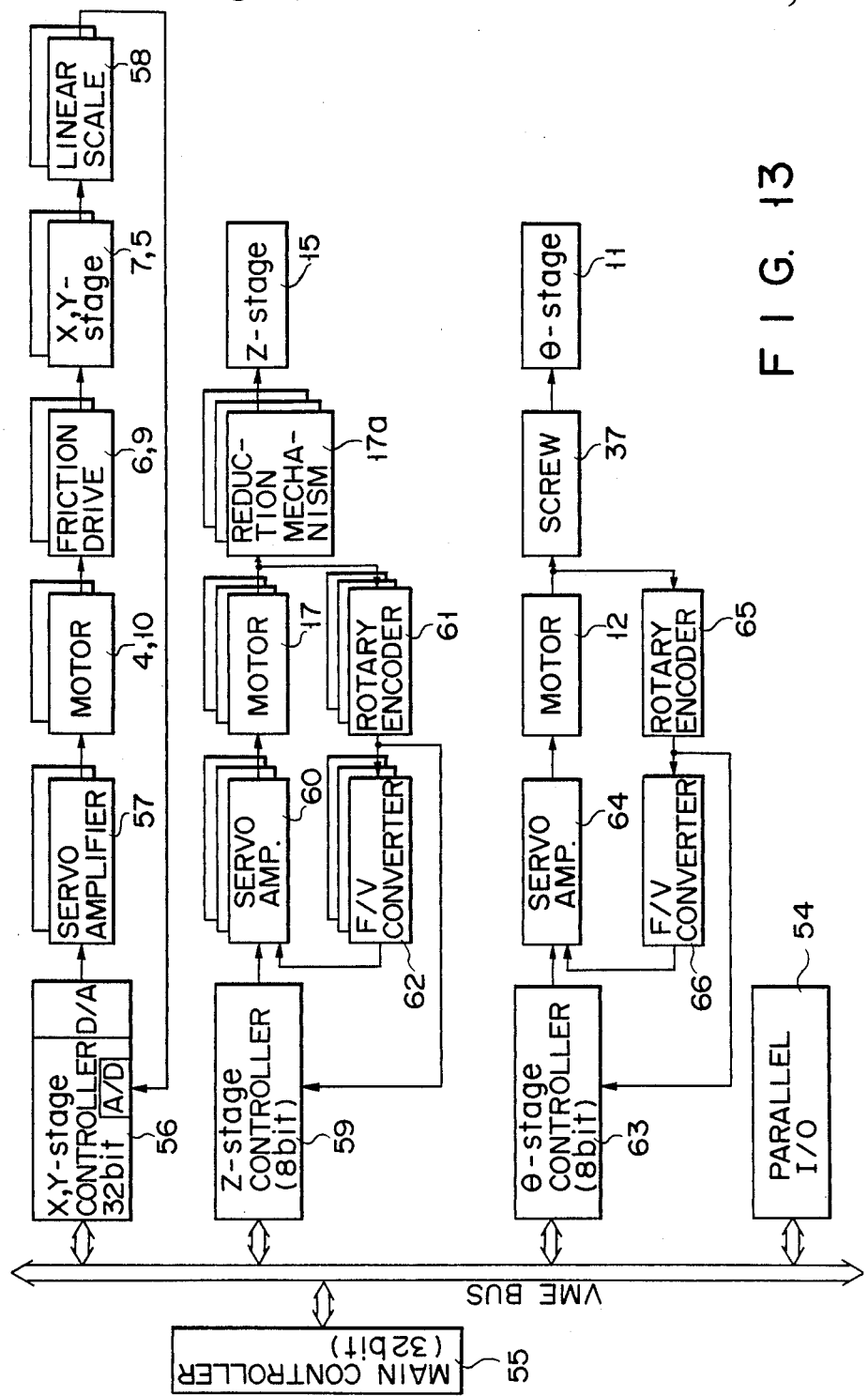
FIG. 13 is a block diagram showing an example of the control system for the alignment stage device shown in FIG. 1.

FIG. 13 shows an example of the control system for the above-described alignment stage device.

In the case of this control system, main controller 55 is a microprocessor of 32 bits, which exchanges with parallel 1/0 (54) through a main bus information relating to the position and posture of 8 stage 11. This main controller 55 further exchanges with x and y stages controller 56, z stage controller 59 and θ stage controller 63 through the main bus information relating to positions and postures of x, y, z and θ stages.

X and y stages controller 56 has four A/D converters. When it receives control information from main controller 55 on the basis of information inputted from parallel 1/0 (54), x and y stages controller 56 calculates how positions of x and y stages change from their reference ones, and compares the control information received with values calculated to send a control signal to servoamplifier 57. X and/or y stage drive motor 10 and/or 4 which is DC servomotor is made operative responsive to the control signal amplified by servoamplifier 57. When x and/or y stage friction drive slider 9 and/or 6 is moved by the friction drive system, x and/or y stage 7 and/or 5 is moved accordingly. This moving amount of x and/or y stage 7 and/or 5 is detected by linear scale 58 and the value detected is sent to A/D converter of x and y stages controller 56. This process is repeated until x and/or y stage 7 and/or 5 comes to its predetermined position.

Z stage controller 59 calculates rotation amounts needed for three z stage drive motors 17 on the basis of control signals applied from main controller 55 and sends control signals to servoamplifiers 60 on the basis of results thus calculated. Servoamplifiers 60 amplify the control signals applied from z stage controller 59 and send them to motors 17. The rotation of each of motors 17 is reduced by reduction system 17a and z stage 15 is moved in the direction of axis z or rotated round axial lines parallel to axes x and y responsive to the rotation amount of each of three motors 17. Z stage 15 thus takes such position and posture as correspond to the rotation amount of each of three motors 17. The rotation amount of each of three motors 17 is detected by rotary encoder 61. The amounts thus detected are fed back to servoamplifiers 60 through F/V converters 62 and further sent to z stage controller 59. This process is repeated until z stage 15 takes its position and posture needed.

θ stage controller 63 calculates the rotation amount needed for θ stage drive motor 12 responsive to instruction applied from main controller 55 and sends a control signal to servoamplifier 64 on the basis of the result thus calculated. Servoamplifier 64 amplifies the control signal and supplies the thus-amplified signal to θ stage drive motor 12. Feed screw 37 is rotated by motor 12 and θ stage 11 is thus rotated. The rotation amount of this drive motor 12 is detected by rotary encoder 65. The amount thus detected is fed back to servoamplifier 64 through F/V converter 66 and further sent to θ stage controller 63. This process is repeated until θ stage 15 takes its position needed.

X and y stages controller 56, z stage controller 59 and θ stage controller 63 have servo-lock and moving modes. These controllers hold x, y and θ stages at their set positions under servo-lock mode, while x, y and θ stages are moved under moving mode to those positions which are calculated on the basis of control information applied from the main controller.

Although the preferred embodiment of the present invention has been described it should be understood that the present invention is not limited to this embodiment but various changes and modifications can be made without departing from the scope of claims appended hereto.

What is claimed is:

1. An alignment stage device comprising:
a base;
a first stage, supported on the base and movable along a first axis on a horizontal plane;
a second stage, supported on the first stage and movable along a second axis, perpendicular to the first axis; and
a third stage, provided with stands on which a work piece is mounted, and guided relative to the second stage, said third stage being rotatable around an axis perpendicular to that plane on which the third stage is positioned;
wherein when the first stage is moved, the second and third stages are moved along the first axis and when the second stage is moved, the third stage is moved along the second axis and wherein the first and second stages are rectangular frames each having a center opening, such that said first and second stages are capable of being arranged with one of said stages being disposed within the center opening of the other, with the third stage being arranged in the center opening of the stage disposed within the center opening of the other.

2. The alignment stage device according to claim 1, further comprising a fourth stage for supporting the third stage relative to the base, means for driving the fourth stage to be tilted relative to the base and moved along a third axis perpendicular to the first and second axis, and a means for causing the third stage to follow the movement of the fourth stage.

3. The alignment stage device according to claim 2, wherein said means for causing the third stage to follow the movement of the fourth stage includes at least three small-diameter steel balls located between the underside of the third stage and the top of the fourth stage.

4. The alignment stage device according to claim 3, wherein said driving means include drive motors located at three positions on the base and around the fourth stage, sliders cause to slide on the upper surface of the base by the drive motors, slopes formed on the sliders and inclined relative to the upper surface of the base, and cam followers attached to the fourth stage in following the slopes to move in the direction of the third axis.

5. The alignment stage device according to claim 4, wherein the first, second and third stages are arranged on a same plane and the fourth stage is located between the third stage and the base.

6. The alignment stage device according to claim 4, wherein the third stage has arc portions, curved around the same point, at at least three positions along its outer rim and said device further including guide means fixed to the second stage to correspond to the arc portions of the third stage and hold the third stage in such a way that the third stage can be tilted relative to the second stage and rotated round an axis line perpendicular to that plane on which the third stage is positioned.

7. The alignment stage device according to claim 6, wherein the guide means includes a bracket fixed to the second stage, a strut supported by the bracket, and a guide ring freely slidably and rotatably attached to the strut through a ball bushing and contacted with the arc portion of the third stage.

8. The alignment stage device according to claim 7, wherein said guide ring has an outer spherical circumference.

9. The alignment stage device according to claim 8, wherein at least one of the guide means pushes the arc portion toward the center of the third stage through the guide ring.

10. The alignment stage device according to claim 9, wherein at least one of the guide means includes a forked bracket having two arms and a section for connecting these arms with each other, a slit formed in each of the arms and directed in the radial direction of the third stage to guide the end of the strut, and springs for urging the strut along the slit in the center direction of the third stage.

11. The alignment stage device according to claim 10, further comprising a plate-like drive slider fixed to the third stage, and a drive means fixed to the second stage and serving to rotate the third stage round an axis line perpendicular to that plane, on which the third stage is positioned, through the drive slider.

12. The alignment stage device according to claim 11, wherein said drive means is a linear actuator comprising a drive motor fixed to the second stage, a feed screw rotated by the drive motor, and a nut member screwed onto the feed screw.

13. The alignment stage device according to claim 12, further comprising a means for transmitting the drive force of the linear actuator to the drive slider of the third stage.

14. The alignment stage device according to claim 13, wherein said means includes tongue pieces projected from both ends of the nut member, and push members fixed to that sides of these tongue pieces which are opposed to each other.

15. The alignment stage device according to claim 14, wherein each of the push members is a one point ball bearing having steel ball freely rotatable on one side of the drive slider (34) and at least one of the push members is urged against the other.

* * * * *